United States Patent [19]

Srinivasan

[11] 4,153,486

[45] May 8, 1979

[54] SILICON TETRACHLORIDE EPITAXIAL PROCESS FOR PRODUCING VERY SHARP AUTODOPING PROFILES AND VERY LOW DEFECT DENSITIES ON SUBSTRATES WITH HIGH CONCENTRATION BURIED IMPURITY LAYERS UTILIZING A PREHEATING IN HYDROGEN

[75] Inventor: Gurumakonda R. Srinivasan, Poughkeepsie, N.Y.

[73] Assignee: International Business Machines Corporation, Armonk, N.Y.

[21] Appl. No.: 912,660

[22] Filed: Jun. 5, 1978

[51] Int. Cl.² .................. H01L 21/205; H01L 21/302
[52] U.S. Cl. .................................... 148/175; 148/1.5; 148/189; 148/191; 156/612; 156/613
[58] Field of Search ............... 148/175, 189, 191, 1.5; 156/612, 613

[56] References Cited

U.S. PATENT DOCUMENTS

| | | | |
|---|---|---|---|
| 3,299,329 | 1/1967 | Pollock | 148/175 X |
| 3,404,450 | 10/1968 | Karcher | 148/175 X |
| 3,501,336 | 3/1970 | Dyer et al. | 148/175 X |
| 3,847,686 | 11/1974 | Stein | 148/175 |
| 3,956,037 | 5/1976 | Ishii et al. | 148/189 |

OTHER PUBLICATIONS

Gupta et al., "Silicon Epitaxial Layers . . . Impurity Profiles" J. Electrochem Soc., vol. 116, No. 11, Nov. 1969, pp. 1561-1565.

Joyce et al., "Impurity Redistribution . . . silicon Layers" IBID, vol. 112, No. 11, Nov. 1965, pp. 1100-1106.

Bratter et al., "Minimizing Autodoping . . . Silicon Epitaxial Layer" I.B.M. Tech. Discl. Bull., vol. 15, No. 11, Apr. 1973, p. 3385.

Maeda et al., "Effect of Vapor Etching . . . Epitaxial Layer" Japan J. Appl. Phys., vol. 13, No. 11, 1974, pp. 1903-1904.

*Primary Examiner*—L. Dewayne Rutledge
*Assistant Examiner*—W. G. Saba
*Attorney, Agent, or Firm*—George O. Saile

[57] ABSTRACT

A method is described for depositing silicon epitaxy with very low defect levels and sharp dopant profiles which are suitable for fabricating high performance, shallow device structures. The epitaxial layer envisioned is less than about 2 microns in thickness. The layer is deposited upon a silicon substrate that has subcollector buried layers therein of above about $1 \times 10^{20}$ N type impurity. The substrate is baked at between about 1120° to 1180° C. in hydrogen and then the epitaxial layer is formed using silicon tetrachloride and a temperature of between about 1000° to 1100° C. thereon.

7 Claims, 4 Drawing Figures

SILICON TETRACHLORIDE EPITAXIAL PROCESS FOR PRODUCING VERY SHARP AUTODOPING PROFILES AND VERY LOW DEFECT DENSITIES ON SUBSTRATES WITH HIGH CONCENTRATION BURIED IMPURITY LAYERS UTILIZING A PREHEATING IN HYDROGEN

DESCRIPTION

1. Technical Field

This invention relates to the method for forming semiconductor devices and in particular to improved silicon epitaxial growth techniques.

2. Background Art

In the drive towards very large scale integration (VLSI) there is a great need for shallow device structures in the submicron range. For this purpose the useful epitaxial thickness is limited to one or two microns or less for silicon devices. The conventional practice does not allow the use of such thin epitaxial layers due to the fact that the outdiffusion from buried layers in the substrate extends to about a micron onto the epitaxy.

This problem is pointed out in "Autodoping Effect of Antimony-Arsenic Simultaneous Diffusion in Silicon" by Y. Tsunoda, Japan J. Appl. Phys. Vol. 16 (1977) No. 8, pp. 1483, 1484. This large outdiffusion is due to the high temperatures used in growing silicon epitaxy, which are typically in the range of 1150°–1200° C. The reason for not using any temperature lower than 1150° C. for silicon epitaxy is the serious deterioration of epitaxial quality at low temperature, especially for substrates with very high concentration of dopants in the buried layers.

There have been prior art attempts to grow silicon epitaxy at low temperatures such as 1000° C. In one method of J. P. Short, U.S. Pat. No. 3,189,494, issued June 15, 1965, an initial coating of 0.1 micron epitaxy was grown initially at a very high temperature in the range of 1250° to 1360° C. The deposition temperature was then reduced to a temperature not lower than 1000° C. for the remaining epitaxial deposition. The coating technique has not found usage in modern high performance device applications for two reasons. First, the high initial temperature causes excessive depletion of the buried layers. Also, epitaxial quality deteriorates due to diffusion spikes and the release of contaminants from susceptor and quartz ware at this excessively high temperature.

Another technique is the two step process described by T. Ishii in "Silicon Epitaxial Wafer with Abrupt Interface by Two-Step Epitaxial Growth Technique," Journal Electrochem. Soc. Vol 122, Nov. 1975, pp. 1523-1531, and "The Effect of Vapor Etching on 'Diffuse-Up' of Buried Impurities into Epitaxial Layer," Japan J. Appl. Phys. Vol. 13 (1974), No. 11, pp 1903, 1904, which uses silane gas. In order to avoid excessive defects, a prehydrogen chloride, HCl, vapor etch is used at a high temperature such as 1200° C. Although HCl etch helps somewhat in the reduction of defects, HCl vapor introduces further complication into the process. These are the contaminants that are in the HCl gas itself, the release of contaminants from the other parts of the reactor through HCl etching, formation of submicroscopic precipitation at the substrate to epitaxy interface, enhanced pattern shift and pattern deterioration. For these and other reasons, silane deposition technique is not suitable for high performance integrated circuit applications.

Silicon tetrachloride has been suggested as a source of silicon in the epitaxial growth on silicon substrates by A. V. Badami, et al, U.S. Pat. No. 3,669,769 and W. A. Edel, et al, U.S. Pat. No. 3,982,974. The Edel et al patent in their description of the prior art column 2, lines 19-26, they state that another prior art attempt to solve the autodoping problem involved lowering the deposition temperature to minimize outdiffusion of the impurity into the gas during the epitaxial deposition. Although this did reduce the autodoping effect somewhat, the process was not feasible because the resulting epitaxial layer had an excessive number of crystallographic defects. Badami et al describe a process using a prebake at the epitaxial deposition temperature followed by epitaxial deposition first at a slow rate and then a faster rate to overcome the autodoping problem.

SUMMARY OF THE PRESENT INVENTION

The present invention avoids the use of silane and hydrogen chloride vapor etching and the resulting undesirable effects. It provides for the usage of silicon tetrachloride, $SiCl_4$ at low temperature against the popular belief that at low temperatures the quality of the epitaxy from $SiCl_4$ is very poor. In order to achieve this, the substrate is first heated in a hydrogen carrier gas flow to a temperature between 1120°–1180° C. and held without deposition for a short period of time in the range of 4–35 minutes depending on the bake temperature selected. The substrate temperature is then lowered to the desired deposition temperature between 1000° and 1100° C., and the $SiCl_4$ gas, together with any dopant gas needed, is then fed into the reactor. This causes the epitaxial deposition at low temperature. The deposition is continued to achieve the desired epitaxial thickness. It is desirable to hold the growth rate to as low a value as practical in order to achieve low autodoping, low pattern shift, and good thickness control.

This method of fabricating shallow device structure decouples the three factors that limit the usefulness of epitaxy, namely, (1) extent of impurity outdiffusion from the substrate, (2) epitaxial quality in terms of electrically active defects, and (3) extent of autodoping. In the conventional processes these factors act in opposition such that any useful process has to strike out an optimum balance between these factors. Since in the present process the factors are uncoupled, each factor can be optimized separately thereby allowing the growth of an epitaxy with much better characteristics from the device point of view. The present method allows:

(1) N type, such as arsenic, semiconductor outdiffusion to be reduced from a typical value of 0.9 microns to about 0.2 microns.

(2) N type, such as arsenic semiconductor autodoping is reduced from the conventional values by about an order of magnitude;

(3) P type, such as boron, outdiffusion and autodoping is reduced considerably;

(4) Electrically active defects are reduced by more than an order of magnitude from the current values, and;

(5) MOS leakage quality is significantly improved. A 50 fold decrease in average leakage current is achieved.

A full combination of these features has never been achieved before, and the present technique thus allows the growth of thin epitaxy of less than about 2 microns for VLSI purposes.

DISCLOSURE OF THE INVENTION

Figure 1:
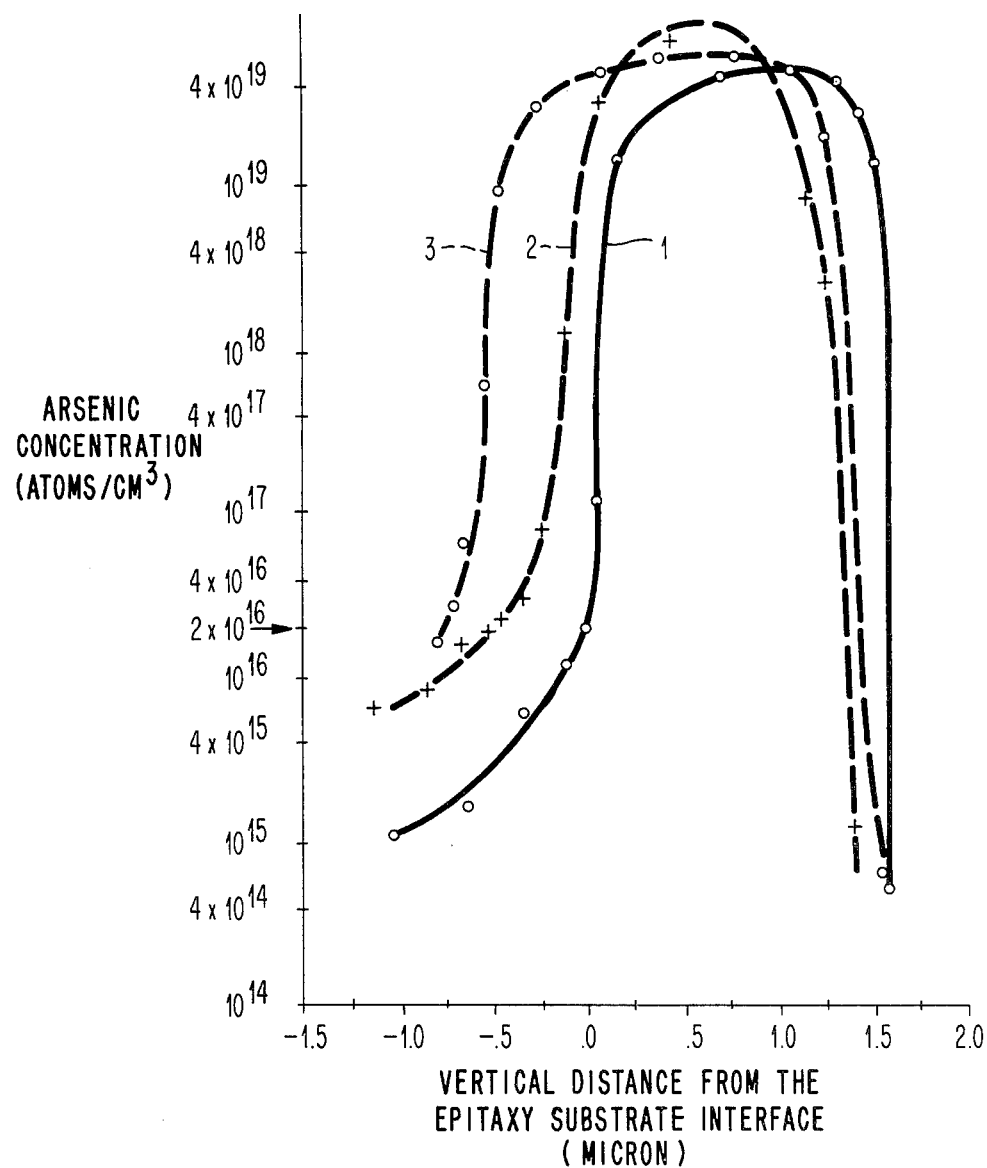
FIG. 1 is a spreading resistance profile of epitaxial layers on substrates having subcollectors for structures made according to the process of Examples 1, 2 and 3. The profile is over the subcollector region.

The fabrication process for very large scale integrated bipolar devices begins by forming buried layers in the silicon substrate. This buried layer is usually intended to be a subcollector, but could be a subemitter in an inverse device structure. The next major step is to form a very thin, in the order of 1 to 2 microns or less, epitaxial layer over the silicon surface having the subcollector therein. The formation of this thin epitaxial layer is all important for the success of the final bipolar devices.

It is important to minimize the autodoping effect. A decrease in the deposition temperature to limit outdiffusion brings about an increase in lateral, that is off the subcollector, autodoping due to a rate limitation determined by the temperature dependence of the impurity incorporation rate. Experiments have shown that a deposition temperature below 1000° C. would not be attractive both in terms of lateral autodoping as well as epitaxial structural quality. The upper limit is about 1100° C. because of unacceptably high outdiffusion beyond this temperature. It has also been found that a decrease in growth rate brings about a decrease in lateral autodoping, and that at between about 0.05 to 0.2 microns/minute the autodoping reactions are close enough to thermodynamic equilibrium that any further decrease in growth rate does not significantly lower lateral autodoping. The lower limit of 0.05 microns/minute represents a practical limit below which it takes excessively long time to deposit epitaxial layer of about one micron thickness. The growth rate beyond 0.2 microns/minute brings about an impurity trapping mechanism which increases the autodoping. In addition, autodoping in $SiCl_4$ system is lower than that in the silane system for identical growth conditions.

The epitaxial quality is related, among other factors, to the quality of the substrate at the time of deposition. Epitaxial quality will improve for processes which maintain a good quality substrate surface just prior to deposition. This improvement is achieved by suitable thermal processing of the wafer just prior to deposition.

The typical subcollector layer formation, using for example arsenic, adopted for the process yields a surface concentration ($C_o$) of about $1.5 \times 10^{21}$ atoms/cm³ or more. Evidence exists that high $C_o$ layer contributes to electrically active defects in the epitaxy, presumably through the formation of arsenic diffusion spikes above the subcollectors. Additionally, it is known that auto-doping is related to $C_o$ and generally decreases with the decrease of $C_o$. A study of pre-epitaxial baking effect on autodoping showed a direct correlation of the time and temperature of the prebake cycle with the amount of lateral autodoping and electrically active defect density in the epitaxy. It has been found that the prebake effects can be quantitatively understood in terms of a temperature-dependent arsenic evaporation rate and the consequent source depletion during the pre-epitaxial bake cycle. The subcollector source depletion just prior to growing epitaxy is advantageous, both in terms of autodoping as well as structural quality, providing that this depletion is not excessive such that high conductivity of the buried layer is maintained.

The high surface concentration in the subcollector layers is also the result of an impurity pileup in the silicon at the silicon dioxide, $SiO_2$, to silicon, Si, interface which forms during the drive-in oxidation cycle. A substantial amount of impurity resides in the top few thousand Angstrom layer of the substrate, and much of this impurity is electrically inactive. The removal of the electrically inactive arsenic from the top layers of the substrate prior to growing epitaxy should be beneficial to the process without, at the same time, increasing significantly the sheet resistivity of the subcollectors.

On the basis of the above considerations, a preepitaxial baking cycle is used in the process. Examination of our prebake data showed that one could decrease off-subcollector peak concentration by almost an order of magnitude by baking at between about 1120° to 1180° for about 4 to 35 minutes, depending on the bake temperature selected, prior to growing epitaxy at the lower temperature. A baking temperature higher than 1180° C. is not attractive from the point of view of the epitaxial quality, because a 1200° C. baking followed by a 1000° C. deposition resulted in poor epitaxial quality. Below 1120° C. is not desirable because of excessively long baking period necessary to achieve similar reduction in autodoping. This deterioration of the structural quality due to bake at temperatures higher than 1180° C. is not surprising in view of the accelerated evaporation and $H_2$ etching of silicon expected at these high temperatures.

The following examples are included merely to aid in the understanding of the invention and variations may be made by one skilled in the art without departing from the spirit and scope of the invention.

EXAMPLES 1, 2 AND 3

Epitaxial depositions were made on 2¼ inch diameter substrates composed of P-<100> silicon and having arsenic subcollector diffusion therein covering 62% of the water surface having a $C_o$ of about $1.5 \times 10^{21}$ atoms/cm³. The conditions for the deposition for each Example is given in Table I.

Table I

|  | Examples | | |
| --- | --- | --- | --- |
|  | 1 | 2 | 3 |
| Source Species | $SiCl_4$ | $SiCl_4$ | $SiCl_4$ |
| Pre-Epitaxial Bake | 1150° C. for 10 minutes | 1050° C. for 10 minutes | None |
| Deposition Temperature | 1050° C. | 1050° C. | 1150° C. |
| Growth Rate in microns/minute | 0.08 | 0.08 | 0.08 |
| Carrier Gas Flow $H_2$ in liters/minute (linear flow rate | 20.6 | 20.6 | 20.6 |

Table I-continued

| | Examples | | |
|---|---|---|---|
| | 1 | 2 | 3 |
| in cm/sec) | (10.5) | (10.5) | (10.5) |

All epitaxial depositions were intrinsic, i.e., no external doping was used. Epitaxial depositions were made in an RF heated horizontal reactor with a 3° inclined silicon carbide coated graphite susceptor, which was designed to provide minimal radial temperature gradient across the wafer. Radial $\Delta T$ was $\leq 5°$ C. across the $2\frac{1}{4}$ inch wafer.

Figure 2:
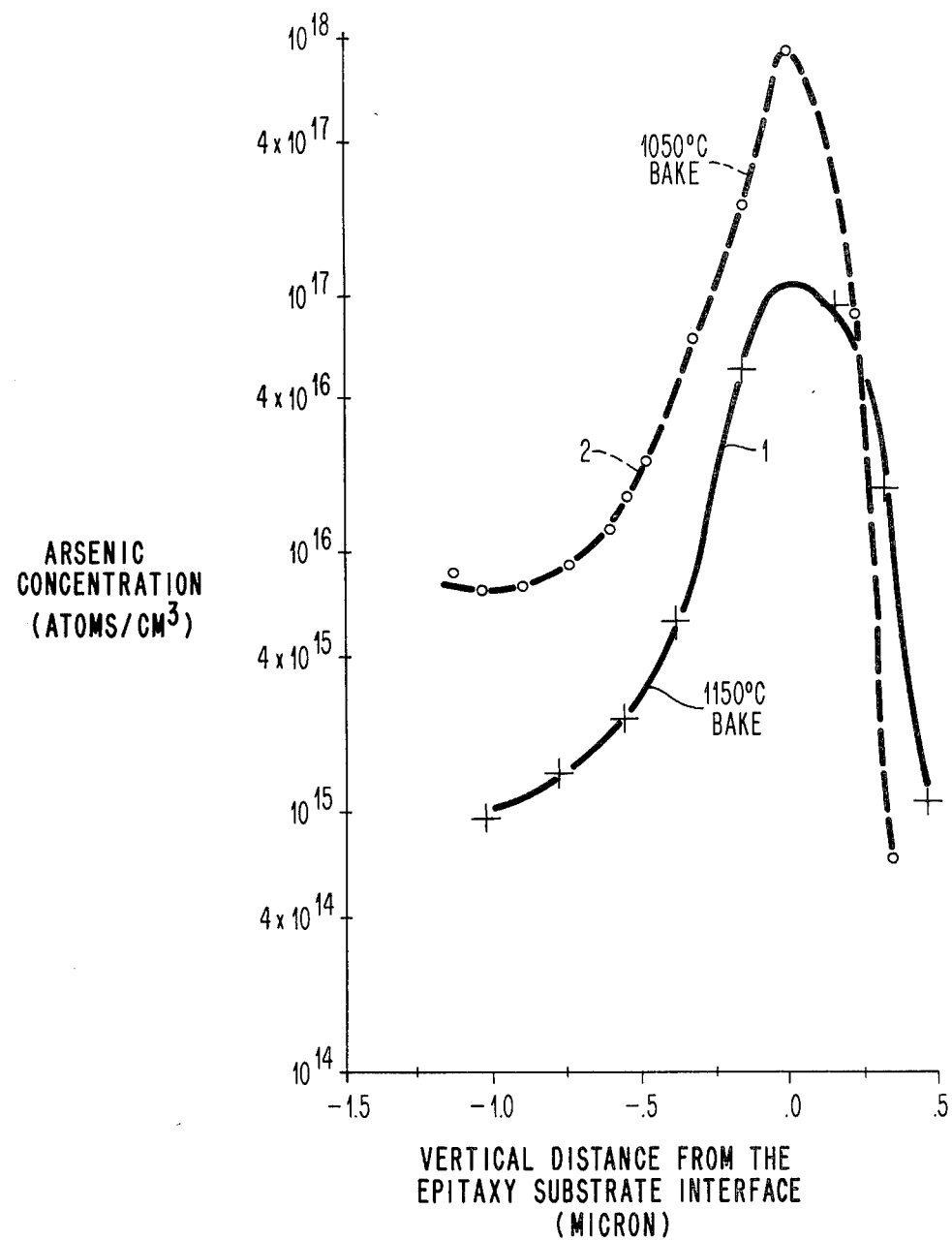
FIG. 2 is a spreading resistance profile of epitaxial layers on substrates having subcollectors for structure made according to the process of Examples 1 and 2. This profile is off the subcollector region, and represents lateral autodoping peak.

Spreading resistance profiles were made on and off subcollector regions and were corrected using the existing APL program. The results were plotted in FIGS. 1 and 2. FIG. 1 shows the vertical dopant profile over the subcollector region. FIG. 2 shows the vertical dopant profile at about 50 microns off the subcollector region.

The figures show that outdiffusion, $\Delta X$, defined as the thickness above the substrate-epitaxial interface with arsenic concentration larger than $2 \times 10^{16}$ atoms/cm$^3$ is reduced from about 0.8 micron for the 1150° C. deposition to about 0.5 micron for the 1050° C. deposition without 1150° C. prebake, and this is further reduced to less than 0.1 micron for the 1050° C. deposition with 1150° C. prebake. The off-subcollector autodoping peak concentration (shown in FIG. 2) is also reduced by an order of magnitude by the high temperature pre-epitaxial bake cycle of Example 1 relative to that in Example 2.

Epitaxial quality was determined both by optical microscope examination of the surface and by anodic etching technique to monitor the electrically active defects in the epitaxy. Two etching conditions were used: 5 volts, 5% hydroflouric acid, HF, 1 min, and 2 volts, 5% HF, 1 min, and 5 volts in order to bring out the epitaxial defects at different depths. The 2 volt condition used for one micron epitaxy is believed to be comparable to the 5 V etching condition used to measure the electrically active defect levels in the thicker (2 $\mu$m) epitaxy.

Epitaxial defect density, $\lambda$, was calculated as the fraction of subcollector sites with one or more anodic etch pits.

Table II shows epitaxial quality comparison for substrates with subcollector diffusions between the standard low temperature epitaxial process (Example 2) and that produced by the Example 1. The main difference between the epitaxial conditions of Examples 1 and 2 is the introduction of 1150° C. prebake prior to 1050° C. deposition in Example 1. The electrically active defect level as measured by the anodic etching technique is reduced from 10% in Example 2 to less than 1% in Example 1 at 2 V bias measurement, or from about 15% in Example 2 to about 1.5% in Example 1 at 5 V bias. At both voltages the defect level is reduced by an order of magnitude due to the introduction of the 1150° C. prebake.

Table II

| | Defect Density (% S/C Sites) | |
|---|---|---|
| Example | 2V Bias | 5V Bias |
| 2 | | 13.2 |
| 2 | 10.0 | 15.6 |
| 1 | 0.44 | 1.18 |
| 1 | 0.73 | 1.50 |

EXAMPLES 4, 5, 6 AND 7

To test the process advantage on substrates without subcollector diffusions therein an experiment was carried out under the flow conditions similar to that of Examples 1, 2 and 3 with the exception that a 5 micron thick, 1 ohm cm N type epitaxial layer was grown on each substrate, and the prebake and deposition temperatures were as indicated in Table III.

Table III

| | Examples | | | |
|---|---|---|---|---|
| | 4 | 5 | 6 | 7 |
| Source Species | SiCl$_4$ | SiCl$_4$ | SiCl$_4$ | SiCl$_4$ |
| Dopant Species | As | As | As | As |
| Pre-Epitaxial Bake | 1150° C. for 5 minutes | 1150° C. for 5 minutes | 1150° C. for 5 minutes | 1150° C. for 5 minutes |
| Deposition Temperature | 1000° C. | 1050° C. | 1100° C. | 1150° C. |
| | Examples | | | |
| | 8 | 9 | 10 | |
| Source Species | SiCl$_4$ | SiCl$_4$ | SiCl$_4$ | |
| Dopant Species | As | As | As | |
| Pre-Epitaxial Bake | 1000° C. for 5 minutes | 1050° C. for 5 minutes | 1100° C. for 5 minutes | |
| Deposition Temperature | 1000° C. | 1050° C. | 1100° C. | |

EXAMPLES 8, 9, AND 10

The process of the Examples 4, 5, and 6 were carried out with the exception that the 1150° C. prebake step was replaced with a prebake at the corresponding deposition temperature as given in Table III.

Figure 3:
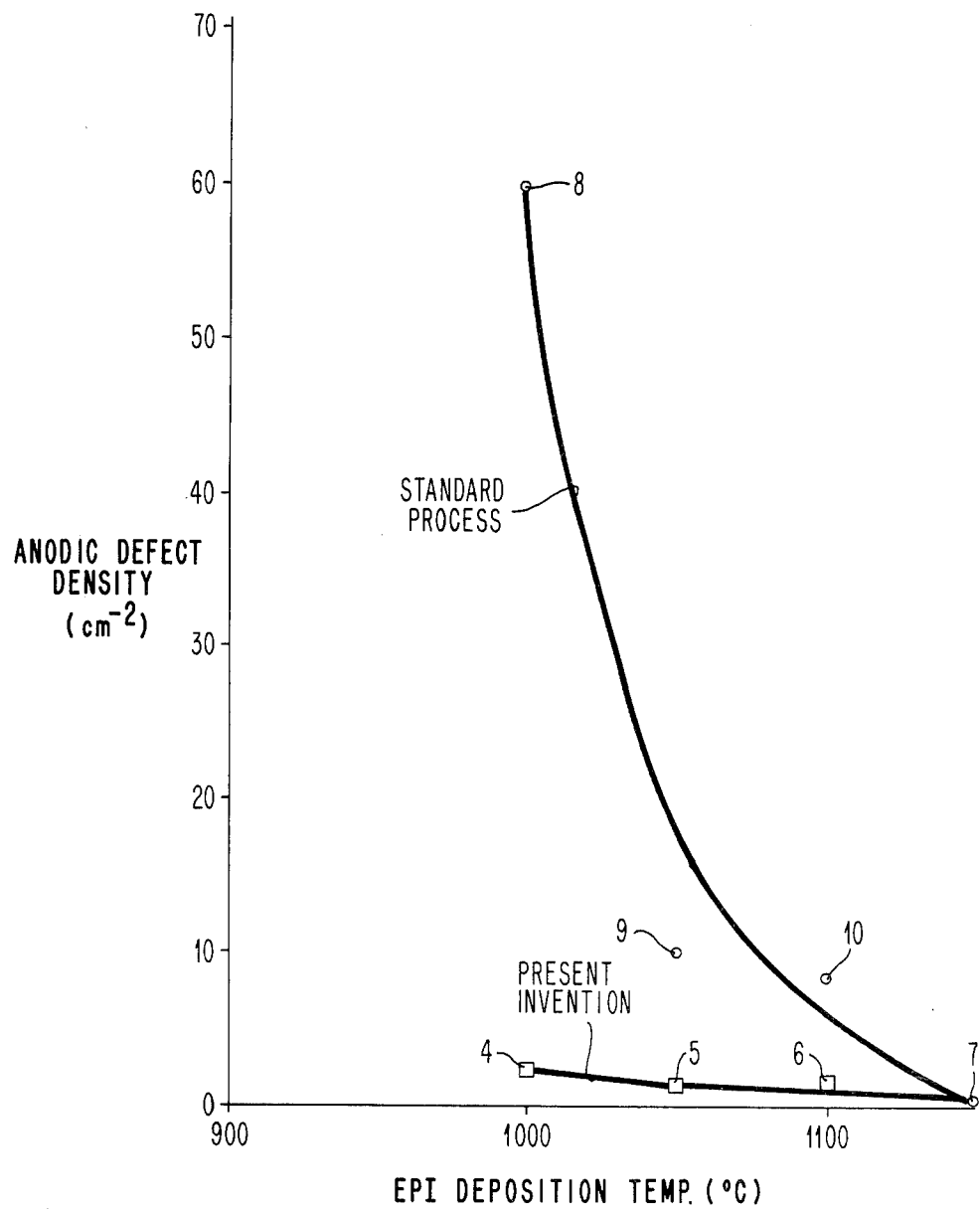
FIG. 3 is a comparison of epitaxial quality in terms of electrically active defects between Examples 4–10 on substrates without buried layers.

FIG. 3 shows the results of anodic defect etching for Examples 4, 5, 6 and 7 plus the corresponding values for standard epitaxial depositions of Examples 8, 9, and 10. From this it is clear that at each temperature, the new process produces a considerably lower defect density. Most remarkable is the difference at the 1000° C. deposition where the standard process Example 8 produces a defect level of 50 defects/cm$^2$ whereas the Example 4 process brings this down to about 2 defects/cm$^2$.

Figure 4:
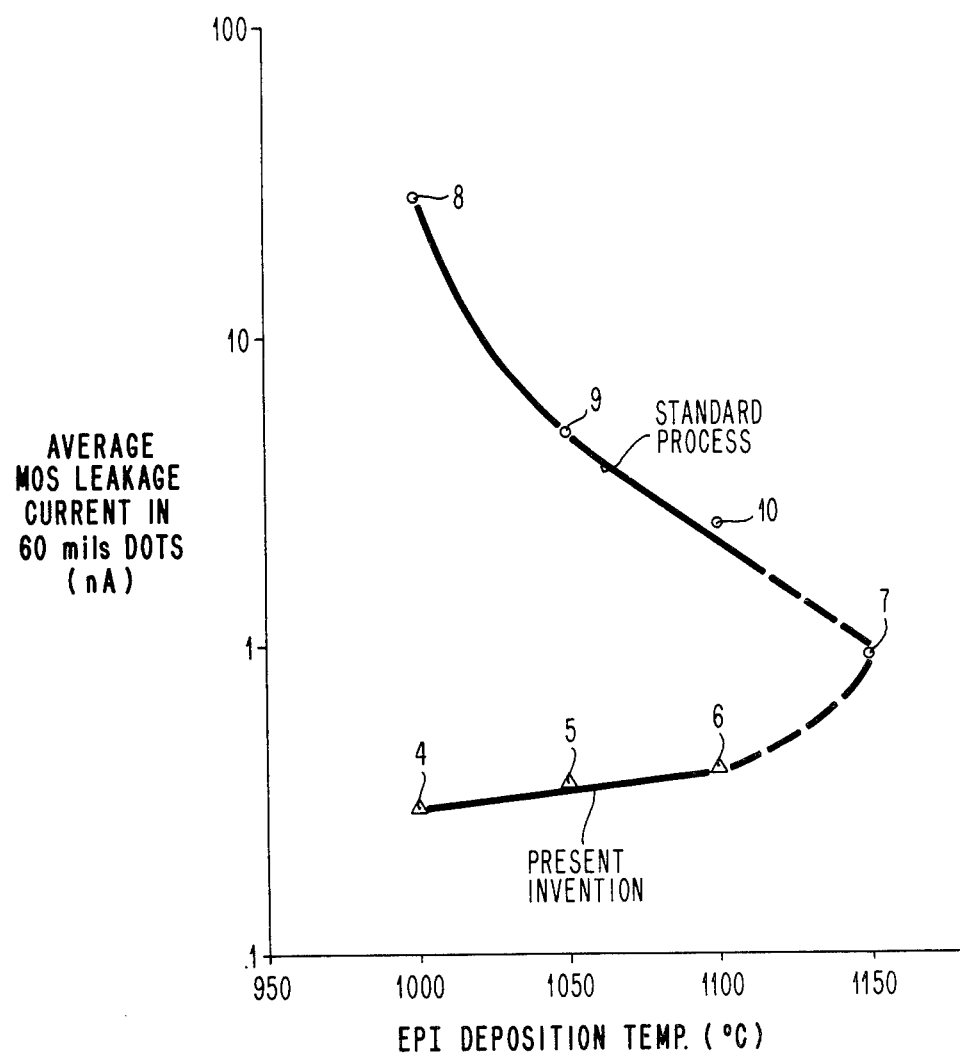
FIG. 4 is a comparison of epitaxial quality in terms of MOS leakage current between the Examples 4–10.

In order to check the MOS leakage quality of the epitaxy standard MOS leakage measurements were made on 60 mil size MOS dots. Table IV shows MOS leakage results for an average of 100 dots on 2 wafers from each of the Examples 4 through 10. For 1000° C. deposition, the average leakage current for Example 8 is 28.63 nA whereas for the new process in Example 4 this level is reduced to 0.31 nA. Similar advantages can be seen for deposition temperatures of 1050° C. in Examples 5 and 9, and 1100° C. in Examples 6 and 10. Most remarkable is the number of MOS dots with leakage current, $I_L$, less than 0.1 nano amps, nA, has been increased from 0 to 42 at 1000° C. and from 0 to 29 at 1050° C. Similarly, MOS dots with high leakage (>0.5 nA) is decreased from 67 to 25 at 1000° C. and from 73 to 27 at 1050° and from 48 to 6 at 1100° C. using the present invention. These results are summarized in FIG. 4 in which the average leakage current is plotted as a function of deposition temperature for both the standard process and for the present process. The quality improvement due to the present process is evident at all temperatures considered in these experiments.

Table IV

|  | Ex. 8 | Ex. 4 | Ex. 9 | Ex. 5 | Ex. 10 | Ex. 6 | Ex. 7 |
|---|---|---|---|---|---|---|---|
| Average Leakage Current ($I_L$) in nano amps (nA) | 28.63 | 0.31 | 49.70 | 0.37 | 25.30 | 0.40 | 0.95 |
| # MOS Dots with $I_L < .1$ | 0 | 42 | 0 | 29 | 2 | 0 | 0 |
| # MOS Dots with $0.1 < I_L < 0.5$ nA | 0 | 7 | 4 | 18 | 11 | 54 | 41 |
| # MOS Dots with $I_L > 0.5$ nA | 67 | 25 | 73 | 27 | 48 | 6 | 47 |

Having thus described my invention, what I claim as new, and desire to secure by Letters Patent is:

1. A method for forming an epitaxial silicon layer less than about 2 microns thick with very low electrically active defect densities and low leakage current and high MOS lifetimes comprising:
   bake bare silicon substrate having buried dopant layers therein and with a surface concentration above about $1 \times 10^{20}$ atoms per cm$^3$ N type at 1120° to 1180° C. in hydrogen; and
   grow an epitaxial layer using silicon tetrachloride between about 1000° to 1100° C.

2. The method of claim 1 wherein the growth rate of said epitaxial layer is between about 0.05 to 0.2 microns/minute.

3. The method of claim 1 wherein said bake is for between about 4 to 35 minutes.

4. The method of claim 1 wherein the carrier gas for said silicon tetrachloride is hydrogen and the gas flow is greater than about 10 cm per second linear velocity.

5. The method of claim 1 wherein arsenic is the N type impurity in said buried dopant layer.

6. The method of claim 1 wherein a arsenic dopant specie is used in forming said epitaxial layer.

7. The method of claim 1 wherein said bake temperature is about 1150° C. and the growth of said epitaxial layer is at about 1050° C.

* * * * *